United States Patent [19]

Petrosian et al.

[11] Patent Number: 4,543,342
[45] Date of Patent: Sep. 24, 1985

[54] SINGLE-CRYSTALLINE JEWELRY MATERIAL BASED ON ALUMINIUM GARNETS

[76] Inventors: Ashot G. Petrosian, Aboviana, 39, kv. 16; Armen S. Kuzanian, Moskovskaya, 31, kv. 14; Karine L. Ovanesian, Tamaniana, 3, kv. 59; Tatyana I. Butaeva, Charentsa, 27, kv. 3, all of Erevan; Grigory O. Shirinian, dom 8, kv. 2, Ashtarak-2, Nauchny gorodok IFI; Ashot A. Avetisian, Ulitsatu-Barekamutian, 1, pik, 14, kv. 34, Erevan, all of U.S.S.R.

[21] Appl. No.: 552,122
[22] PCT Filed: Feb. 26, 1982
[86] PCT No.: PCT/SU82/00011
    § 371 Date: Oct. 24, 1983
    § 102(e) Date: Oct. 24, 1983
[87] PCT Pub. No.: WO83/02963
    PCT Pub. Date: Sep. 1, 1983
[51] Int. Cl.$^4$ .......................... C01F 17/00; C04B 35/50
[52] U.S. Cl. ....................................... 501/86; 423/263; 423/265
[58] Field of Search ................... 501/86; 423/263, 265
[56] References Cited

U.S. PATENT DOCUMENTS 3,761,292  9/1973  Lepore et al. .................. 501/86

FOREIGN PATENT DOCUMENTS 152909    4/1974  Czechoslovakia .
153870    4/1974  Czechoslovakia .
55-36639  9/1980  Japan .
WO83/02963 9/1983 PCT Int'l Appl. .
594628    5/1978  U.S.S.R. .

OTHER PUBLICATIONS

Reviews on Electronic Technique by B. N. Grechushnikov, et al, Serial No. 10, issue 3(418), 4(423), published 1976 ("Elektronika" Moscow), B. N. Grechushnikov et al., Opticheskie svoistva i primenenie v lazerakh kristallov ittrii–aluminievogo granata, pp. 83–87.

Kristall und Technik Crystal Research and Technology, Heft 2, 1975, Band 10, by Kvapil et al, pp. 161–165, Dated 1975, "O Centre Formation in YAG Crystals Doped with Rare Earth Ions".

"Sintez mineralov i eksperimentalnye issledovania", Editor A. A. Shaposhnikova to al. (Nedra, Moscow), pp. 72–75.

6 Mezhdunarodnaya konferentsia po rostu kristallov, Rasshirennye tezisy, vol. III, "Rost iz rasplavov i vysokotemperaturnykh rastvorov", 1980, Moscow S. F. Akhmetov et al, Growing coloured varieties of yttrium–aluminium garnets by the method of horizontally directed crystallization, pp. 83–84.

*Primary Examiner*—Mark L. Bell
*Attorney, Agent, or Firm*—Lilling & Greenspan

[57] ABSTRACT

A single-crystalline jewelry material based on aluminium garnets of the general formula: $Re_3Al_5O_{12}$, wherein $Re = Y$, Dy, Ho, Er, Tm, Lu and containing two dyeing additives. One of the additives is selected from the group consisting of europium in an amount of from $10^{-3}$ to 3% by weight or ytterbium in an amount of from 0.1 to 61.3% by weight and the other is selected from the group consisting of zirconium or silicon in an amount of from $10^{-4}$ to 1% by weight, or hafnium in an amount of from $10^{-3}$ to 3% by weight. The material has a color smoothly changing from green to violet.

9 Claims, No Drawings

SINGLE-CRYSTALLINE JEWELRY MATERIAL BASED ON ALUMINIUM GARNETS

FIELD OF THE INVENTION

The present invention relates to artificial single crystals and, more specifically, to a single-crystalline jewelry material based on aluminium garnets.

BACKGROUND OF THE INVENTION

Known in the art are single crystals of yttrium-aluminium garnet $Y_3Al_5O_{12}$ containing cobalt as a dyeing additive in an amount of from 0.01 to 3% by weight. Depending on the amount of the dyeing additive the crystals have a blue, green-blue or green colour (cf. ČSSR Pat. No. 152909 Int. Cl. B 01 j 17/02, published 08.12.71).

Also known are single crystals of yttrium-aluminium garnet $Y_3Al_5O_{12}$ of a green colour containing, as the dyeing additive, vanadium in the amount of 0.01% by weight (cf. ČSSR Pat. No. 153870, Int. Cl. B 01 j 17/02, published 25.10.71).

To provide $Y_3Al_5O_{12}$ crystals of a deep green colour with a slight sky-blue and emerald shade, chromium oxides are introduced into the starting charge in an amount of 0.11 to 0.27% by weight, cobalt oxide—in an amount of 0.21–1.38% by weight, iron oxide in an amount of 0.20 to 1.33% by weight and neodymium oxide—in an amount of 0.05 to 0.30% by weight (cf. U.S. Pat. No. 3,761,292 Int. Cl. C 04 B 35/00, published 25.09.73).

These materials contain, as dyeing additives, chromium, vanadium, cobalt, iron. Oxides of these dyeing additives have relatively high values of vapour tension which causes difficulties in the process of the production of uniform deep-coloured single crystals, especially under high vacuum conditions. This factor limits the opportunities for a large-scale production of these materials for jewelry applications.

Furthermore, formulations of these materials do not provide for the possibility of controlling the brightness of the material dyeing into a definite colour, smooth colour variation within a broad colour range, as well as obtaining a violet colour which is of interest for simulation of, for example, amethyst in jewelry articles.

SUMMARY OF THE INVENTION

The present invention is directed to the provision, by selection of new combinations of dyeing additives in appropriate proportions, of a single-crystalline jewelry material based on aluminium garnets which would have a colour smoothly varying from green to violet, a predetermined brightness and depth of dyeing into a given colour.

This object is accomplished by a single-crystalline jewelry material base of aluminium garnets corresponding to the general formula: $Re_3Al_5O_{12}$, wherein Re is Y, Dy, Ho, Er, Tm, Lu in combination with dyeing additives. According to the present invention, two additives used include one which is selected from the group of europium, in an amount of $10^{-3}$ to 3% by weight and ytterbium in an amount of from 0.1 to 61.3% by weight and the other is selected from a group of zirconium or silicon in an amount of $10^{-4}$ to 1.0% by weight, or hafnium in an amount of from $10^{-3}$ to 3% by weight.

To impart to the material according to the present invention a green colour of a moderate brightness, ytterbium in an amount of from 0.1 to 9% by weight and zirconium in an amount of from $10^{-3}$ to 1% by weight are used as dyeing additives. To impart a bright-green colour to the material according to the present invention, it preferably contains, as the dyeing additives, ytterbium in an amount of from 0.1 to 25% by weight and silicon in an amount of from $10^{-2}$ to 1% by weight. To impart a green-sky-blue or sky-blue colour to the material according to the present invention, it is advisable that it contain ytterbium as the dyeing additive in an amount of from 25 to 61.3% by weight and silicon in an amount of from $10^{-4}$ to 0.1% by weight. To obtain colour of from blue to violet-blue, the material according to the present invention should preferably contain, as the dyeing additive, ytterbium in an amount of from 10 to 61.3% by weight and zirconium in an amount of from $10^{-4}$ to 0.1% by weight. To impart a bright-blue colour imitating that of a naturally-occurring sapphire, the material according to the present invention preferably contains europium as the dyeing additive in an amount of from 0.01 to 1% by weight and zirconium or silicon in an amount of from $10^{-2}$ to 0.5% by weight, or hafnium in an amount of from $10^{-2}$ to 1% by weight.

To impart, to the material according to the present invention, a yellowish-green to green colour, it preferably contains, as the dyeing additive, ytterbium in an amount of from 0.1 to 30% by weight and silicon or hafnium in an amount of from $10^{-2}$ to 1% by weight. To impart, to the material of the present invention, a pink-violet to dark-blue colour, it preferably contains as the dyeing additive europium in an amount of from 0.01 to 1% by weight and zirconium or silicon or hafnium in an amount ranging from $10^{-2}$ to 1% by weight. To obtain a bright-violet colour approaching that of a naturally-occurring amethyst, the material according to the present invention preferably contains, as the dyeing additive, europium in an amount of from 0.01 to 1% by weight, and zirconium or silicon in an amount of from $10^{-2}$ to 0.5% by weight, or hafnium in an amount ranging from $10^{-2}$ to 1% by weight.

Depending on the particular combination of the additives and concentration thereof, as well as on selection of the basis of aluminium garnets, the single-crystalline jewelry according to the present invention has an arbitrarily predetermined colour within a wide range of a colour scale from green to violet with the possibility of adjusting the intensity and brightness of dyeing within a wide range.

The oxides of the dyeing additives employed for the production of a single-crystalline jewelry material according to the present invention have comparatively low vapour tension values, whereby the procedure for the production of the material according to this invention is rendered simpler and deep and dark dyeing shades are obtained, as well as uniformity of dyed single crystals. Compositions with zirconium and hafnium are stable under deep vacuum conditions. The single-crystalline jewelry material according to the present invention has a green colour very closely matching that of emeralds. Bluish colored single-crystals resemble naturally-occurring sapphires; the blue crystals with dyeing additives of europium and zirconium or silicon, or hafnium in light dyeing shades have the colour-change effect, namely, under artificial illumination their colour changes to violet. Green-sky-blue single crystals have the colour of naturally-occurring aquamarines and the material composition allows for adjustment of the shares of both green and blue colours in the general dyeing of the material. Violet single-crystals have the colour of naturally-occurring amethysts.

DETAILED DESCRIPTION OF THE INVENTION

The single-crystalline jewelry material based on aluminium garnets according to the present invention can be produced by conventional methods for growing refractory single-crystals from a melt, for example, using Bridgeman-Stockbarger, Chokhralsky methods, debiteuses and the like. The dyeing additives are introduced into the starting charge in the form of corresponding oxides such as $Eu_2O_3$, $Yb_2O_3$, $ZrO_2$, $SiO_2$, $HfO_2$. For a better understanding of the present invention the following specific examples illustrating the single-crystalline jewelry material are given hereinbelow.

EXAMPLE 1

A single-crystalline jewelry material based on yttrium-aluminum garnet $Y_3Al_5O_{12}$ containing ytterbium in the amount of 3% by weight and zirconium in the amount of 0.074% by weight as the dyeing additives is produced by the Bridgeman-Stockbarger method. A mixture of oxides consisting of the following components, percent by weight:

| | |
|---|---|
| $Y_2O_3$: | 54.13 |
| $Al_2O_3$: | 42.26 |
| $Yb_2O_3$: | 3.51 |
| $ZrO_2$: | 0.1 | is placed into a molybdenum container, heated to a temperature of about 2,000° C. and crystallized at the speed of movement of the stretching mechanism of 2.5 mm/hr. The thus-produced crystal has a green colour with a moderate brightness.

EXAMPLE 2

A single-crystalline jewelry material based on $Y_3Al_5O_{12}$ containing ytterbium in the amount of 6.15% by weight and silicon in the amount of 0.2% by weight as the dyeing additives are produced in a manner similar to that described in the foregoing Example 1. As the starting components a mixture of the following oxides, percent by weight is used:

| | |
|---|---|
| $Y_2O_3$: | 51.05 |
| $Al_2O_3$: | 41.45 |
| $Yb_2O_3$: | 7.0 |
| $SiO_2$: | 0.5 |

The resulting material has a deep bright-green colour close to that of emerald-green.

EXAMPLE 3

A single-crystalline jewelry material based on $Y_3Al_5O_{12}$ containing ytterbium in the amount of 1.8% by weight and hafnium in the amount of 0.25% by weight is produced in a manner similar to that described in Example 1. As the starting components, a mixture of the following composition is used, percent by weight:

| | |
|---|---|
| $Y_2O_3$: | 55.176 |
| $Al_2O_3$: | 42.428 |
| $Yb_2O_3$: | 2.096 |
| $HfO_2$: | 0.3. |

The thus-produced material has a bright-green colour.

EXAMPLE 4

A single-crystalline jewelry material based on $Y_3Al_5O_{12}$ containing ytterbium in the amount of 30% by weight and silicon in the amount of 0.02% by weight as the dyeing additives is produced in a manner similar to that described in Example 1 hereinbefore. As the starting components a mixture of oxides of the following composition is used, percent by weight;

| | |
|---|---|
| $Y_2O_3$: | 29.13 |
| $Al_2O_3$: | 36.66 |
| $Yb_2O_3$: | 34.16 |
| $SiO_2$: | 0.05 |

The resulting crystal has a dark-green colour with a sky-blue shade.

EXAMPLE 5

A single-crystalline jewelry material based on $Y_3Al_5O_{12}$ containing ytterbium in the amount of 46% by weight and silicon in the amount of 0.005% by weight as the dyeing additives is produced as described in Example 1. As the starting components a mixture of oxides of the following composition is used:

| | |
|---|---|
| $Y_2O_3$: | 14.26 |
| $Al_2O_3$: | 33.33 |
| $Yb_2O_3$: | 52.4 |
| $SiO_2$: | 0.01. |

The resulting crystal has a green-sky-blue colour close to that of aquamarine.

EXAMPLE 6

A single-crystalline jewelry material based on $Y_3Al_5O_{12}$ containing ytterbium in the amount of 58% by weight and silicon in the amount of 0.004% by weight as the dyeing additives is produced following the procedure described in Example 1 hereinbefore. As the starting components a mixture of oxides of the following composition is used, percent by weight:

| | |
|---|---|
| $Y_2O_3$: | 3.11 |
| $Al_2O_3$: | 30.83 |
| $Yb_2O_3$: | 66.05 |
| $SiO_2$: | 0.01. |

The resulting crystal has a bright-sky-blue colour.

EXAMPLE 7

A single-crystalline jewelry material based on $Y_3Al_5O_{12}$ containing ytterbium in the amount of 15.37% by weight and zirconium in the amount of 0.02% by weight as the dyeing additives is produced in a manner similar to that described in Example 1. As the starting components a mixture of oxides of the following composition is used, percent by weight:

| | |
|---|---|
| $Y_2O_3$: | 42.74 |

-continued

| | |
|---|---|
| $Al_2O_3$: | 39.73 |
| $Yb_2O_3$: | 17.5 |
| $ZrO_2$: | 0.03. |

The resulting crystal has a blue colour.

EXAMPLE 8

A single-crystalline jewelry material based on $Y_3Al_5O_{12}$ containing ytterbium in the amount of 30% by weight and zirconium in the amount of 0.02% by weight as the dyeing additives is produced as described in Example 1. As the starting components a mixture of oxides is used which has the following composition, percent by weight:

| | |
|---|---|
| $Y_2O_3$: | 29.14 |
| $Al_2O_3$: | 36.67 |
| $Yb_2O_3$: | 34.16 |
| $ZrO_2$: | 0.03. |

The resulting crystal has a dark-blue colour with a violet shade.

EXAMPLE 9

A single-crystalline jewelry material based on aluminium garnet containing ytterbium in the amount of 58% by weight and zirconium in the amount of 0.0075% by weight is produced as described in Example 1 hereinbefore. As the starting components a mixture of the following oxides is used, percent by weight:

| | |
|---|---|
| $Y_2O_3$: | 3.11 |
| $Al_2O_3$: | 30.83 |
| $Yb_2O_3$: | 66.05 |
| $ZrO_2$: | 0.01. |

The resulting material has a dark violet-blue colour.

EXAMPLE 10

A single-crystalline jewelry material based on $Y_3Al_5O_{12}$ containing europium in the amount of 0.4% by weight and zirconium in the amount of 0.075% by weight is produced in a manner similar to that described in Example 1. The starting components consists of a mixture of oxides of the following composition, percent by weight:

| | |
|---|---|
| $Y_2O_3$: | 56.7 |
| $Al_2O_3$: | 42.7 |
| $Eu_2O_3$: | 0.5 |
| $ZrO_2$: | 0.1. |

The resulting crystal has a bright dark-blue colour resembling that of sapphire.

EXAMPLE 11

A single-crystalline jewelry material based on $Y_3Al_5O_{12}$ according to Example 10 but containing silicon in the amount of 0.1% by weight instead of zirconium is produced. The resulting crystal has a bright dark-blue colour close to that of sapphire.

EXAMPLE 12

A single-crystalline jewelry material based on $Y_3Al_5O_{12}$ containing europium in the amount of 0.08% by weight and zirconium in the amount of 0.075% by weight is produced in a manner similar to that described in Example 1 hereinbefore. As the starting components a mixture of the following oxides is used, percent by weight:

| | |
|---|---|
| $Y_2O_3$: | 56.93 |
| $Al_2O_3$: | 42.87 |
| $Eu_2O_3$: | 0.1 |
| $ZrO_2$: | 0.1. |

The resulting crystal has a bright-blue colour under daylight illumination which changes to violet under artificial illumination.

EXAMPLE 13

A single-crystalline jewelry material based on $Y_3Al_5O_{12}$ is produced according to Example 12, but instead of zirconium it contains silicon in the amount of 0.05% by weight. The resulting crystal has a bright-blue colour under daylight changing into violet under artificial illumination.

EXAMPLE 14

A single-crystalline jewelry material based on $Y_3Al_5O_{12}$ containing europium in the amount of 0.08% by weight and hafnium in the amount of 0.08% by weight is produced in a manner similar to that described in Example 1 hereinbefore. As the starting components a mixture of the following oxides is used, percent by weight:

| | |
|---|---|
| $Y_2O_3$: | 56.945 |
| $Al_2O_3$: | 42.855 |
| $Eu_2O_3$: | 0.1 |
| $HfO_2$: | 0.1. |

The resulting crystal has a bright-blue colour under daylight changing into violet under artificial illumination.

EXAMPLE 15

A single-crystalline jewelry material on the basis of $Y_3Al_5O_{12}$ is produced according to Example 14, but it contains europium in the amount of 0.5% by weight. The resulting crystal has a dark-blue colour.

EXAMPLE 16

A single-crystalline material for jewelry applications based on dysprosium-aluminium garnet $Dy_3Al_5O_{12}$ contains ytterbium in the amount of 8.7% by weight and silicon in the amount of 0.02% by weight. This material is produced in a manner similar to that described in Example 1 hereinbefore. As the starting components a mixture of oxides is used having the following composition, percent by weight:

| | |
|---|---|
| $Dy_2O_3$: | 58.53 |
| $Al_2O_3$: | 30.97 |
| $Yb_2O_3$: | 10 |
| $SiO_2$: | 0.5. |

The resulting material has a deep green colour.

EXAMPLE 17

A single-crystalline jewelry material based on $Dy_3Al_5O_{12}$ containing europium in the amount of 0.08% by weight and zirconium in the amount of 0.075% by weight is produced in a manner similar to that described in Example 1. As the starting components a mixture of oxides is used having the following composition, percent by weight:

| | |
|---|---|
| $Dy_2O_3$: | 68.56 |
| $Al_2O_3$: | 31.24 |
| $Eu_2O_3$: | 0.1 |
| $ZrO_2$: | 0.1. |

The thus-produced crystal has a blue colour with a slight green shade.

EXAMPLE 18

A single-crystalline jewelry material on the basis of $Dy_3Al_5O_{12}$ containing ytterbium in the amount of 1.8% by weight and silicon in the amount of 0.2% by weight is produced in a manner similar to that described in Example 1. As the starting components a mixture of oxides is used which has the following composition, percent by weight:

| | |
|---|---|
| $Dy_2O_3$: | 66.5 |
| $Al_2O_3$: | 31.21 |
| $Yb_2O_3$: | 2.09 |
| $SiO_2$: | 0.2. |

The resulting crystal has a yellowish-green colour.

EXAMPLE 19

A single-crystalline jewelry material based on $Dy_3Al_5O_{12}$ containing ytterbium in the amount of 1.8% by weight and hafnium in the amount of 0.25% by weight is produced in a manner similar to that described in Example 1. As the starting components a mixture of oxides is used which has the following composition, percent by weight:

| | |
|---|---|
| $Dy_2O_3$: | 66.443 |
| $Al_2O_3$: | 31.171 |
| $Yb_2O_3$: | 2.096 |
| $HfO_2$: | 0.3 |

The thus-produced material has a yellowish-green colour.

EXAMPLE 20

A single-crystalline jewelry material based on holmium-aluminium garnet $Ho_3Al_5O_{12}$ containing ytterbium in the amount of 1.2% by weight and silicon in the amount of 0.1% by weight is produced in a manner similar to that described in Example 1. As the starting components a mixture of oxides is used having the following composition, percent by weight:

| | |
|---|---|
| $Ho_2O_3$: | 67.392 |
| $Yb_2O_3$: | 1.397 |
| $Al_2O_3$: | 30.911 |
| $SiO_2$: | 0.3. |

The thus-produced crystal has a dark-green colour.

EXAMPLE 21

A single-crystalline jewelry material based on $Ho_3Al_5O_{12}$ containing ytterbium in the amount of 1.8% by weight and zirconium in the amount of 0.2% by weight is produced in a manner similar to that described in Example 1 hereinbefore. As the starting components a mixture of oxides having the following composition, percent by weight, is used:

| | |
|---|---|
| $Ho_2O_3$: | 66.702 |
| $Yb_2O_3$: | 2.096 |
| $Al_2O_3$: | 30.902 |
| $ZrO_2$: | 0.3. |

The resulting crystal has a yellowish-green colour.

EXAMPLE 22

A single-crystalline jewelry material based on $Ho_3Al_5O_{12}$ containing europium in the amount of 0.08% and silicon in the amount of 0.04% by weight is produced in a manner similar to that of Example 1. As the starting components a mixture of oxides of the following composition, percent by weight, is used:

| | |
|---|---|
| $Ho_2O_3$: | 68.84 |
| $Al_2O_3$: | 30.96 |
| $Eu_2O_3$: | 0.1 |
| $SiO_2$: | 0.1. |

The thus-produced crystal has a yellowish-green colour.

EXAMPLE 23

A single-crystalline jewelry material based on erbium-aluminium garnet $Er_3Al_5O_{12}$ containing ytterbium in the amount of 3% by weight and hafnium in the amount of 0.34% by weight is produced in a manner similar to that described in Example 1. As the starting components use is made of a mixture of oxides having the following composition, per cent by weight:

| | |
|---|---|
| $Er_2O_3$: | 65.501 |
| $Yb_2O_3$: | 3.494 |
| $Al_2O_3$: | 30.605 |
| $HfO_2$: | 0.4. |

The resulting crystal has a greyish-dark green colour.

EXAMPLE 24

A single-crystalline jewelry material based on $Er_3Al_5O_{12}$ containing ytterbium in the amount of 2.5% by weight and silicon in the amount of 0.04% by weight is produced in a manner similar to that described in Example 1. As the starting components a mixture of oxides is used which has the following composition, percent by weight:

| | |
|---|---|
| $Er_2O_3$: | 66.55 |
| $Al_2O_3$: | 30.45 |
| $Yb_2O_3$: | 2.9 |
| $SiO_2$: | 0.1. |

The resulting crystal has a blue-violet light-shade colour under daylight which changes to a green colour under artificial illumination.

EXAMPLE 25

A single-crystalline jewelry material based on $Er_3Al_5O_{12}$ containing europium in the amount of 0.08% by weight and silicon in the amount of 0.04% by weight is produced as described in Example 1 hereinbefore. As the starting components a mixture of oxides is used which has the following composition, percent by weight:

| | |
| --- | --- |
| $Er_2O_3$: | 69.102 |
| $Al_2O_3$: | 30.698 |
| $Eu_2O_3$: | 0.1 |
| $SiO_2$: | 0.1. |

The resulting crystal has a blue colour under daylight, which turns pinkish-violet under artificial illumination.

EXAMPLE 26

A single-crystalline jewelry material based on $Er_3Al_5O_{12}$ containing europium in the amount of 0.16% by weight and hafnium in the amount of 0.16% by weight is produced as described in Example 1. As the starting components a mixture of oxides is used which has the following composition, percent by weight:

| | |
| --- | --- |
| $Er_2O_3$: | 68.963 |
| $Al_2O_3$: | 30.637 |
| $Eu_2O_3$: | 0.2 |
| $HfO_2$: | 0.2. |

The thus-produced crystal has a dark-blue colour.

EXAMPLE 27

A single-crystalline jewelry material based on $Er_3Al_5O_{12}$ containing europium in the amount of 0.08% by weight and silicon in the amount of 0.04% by weight is produced in a manner similar to that described in Example 1. As the starting components a mixture of oxides is used which has the following composition, percent by weight:

| | |
| --- | --- |
| $Er_2O_3$: | 69.102 |
| $Al_2O_3$: | 30.698 |
| $Eu_2O_3$: | 0.1 |
| $SiO_2$: | 0.1 |

The thus-produced crystal has a blue colour under daylight changing into pink-violet under artificial illumination.

EXAMPLE 28

A single-crystalline jewelry material based on $Er_3Al_5O_{12}$ containing 0.08% by weight of europium and 0.02% of silicon is produced in a manner similar to that described in Example 1 hereinbefore. As the starting components a mixture of oxides is used which has the following composition, percent by weight:

| | |
| --- | --- |
| $Er_2O_3$: | 69.126 |
| $Al_2O_3$: | 30.724 |
| $Eu_2O_3$: | 0.1 |
| $SiO_2$: | 0.05. |

The resulting crystal has a pink-violet colour.

EXAMPLE 29

A single-crystalline jewelry material based on thulium-aluminium garnet $Tm_3Al_5O_{12}$ containing ytterbium in the amount of 8.7% by weight and silicon in the amount of 0.04% by weight is produced as described in Example 1. As the starting components a mixture of oxides is used which has the following composition, percent by weight:

| | |
| --- | --- |
| $Tm_2O_3$: | 59.42 |
| $Yb_2O_3$: | 10 |
| $Al_2O_3$: | 30.48 |
| $SiO_2$: | 0.1. |

The resulting crystal has a bright emerald-green colour with a slight sky-blue shade.

EXAMPLE 30

A single-crystalline jewelry material based on $Tm_3Al_5O_{12}$ containing europium in the amount of 0.12% by weight and hafnium in the amount of 0.08% by weight is produced following the procedure similar to that of Example 1. As the starting components a mixture of oxides is used which has the following composition, percent by weight:

| | |
| --- | --- |
| $Tm_2O_3$: | 69.24 |
| $Eu_2O_3$: | 0.15 |
| $Al_2O_3$: | 30.51 |
| $HfO_2$: | 0.1 |

The thus-produced crystal has a violet colour.

EXAMPLE 31

A single-crystalline jewelry material based on $Tm_3Al_5O_{12}$ containing europium in the amount of 0.08% by weight and zirconium in the amount of 0.1% by weight is produced as described in Example 1 hereinbefore. As the starting components a mixture of oxides is used which has the following composition, percent by weight:

| | |
| --- | --- |
| $Tm_2O_3$: | 69.24 |
| $Eu_2O_3$: | 0.1 |
| $Al_2O_3$: | 30.51 |
| $ZrO_2$: | 0.15. |

The thus-produced crystal has a violet colour.

EXAMPLE 32

A single-crystalline jewelry material based on lutecium-aluminium garnet $Lu_3Al_5O_{12}$ containing ytterbium in the amount of 2.4% by weight and hafnium in the amount of 0.3% by weight is produced in a manner similar to that described in Example 1. As the starting components a mixture of oxides is used which has the following composition, percent by weight:

| | |
| --- | --- |
| $Lu_2O_3$: | 66.992 |
| $Al_2O_3$: | 29.813 |
| $Yb_2O_3$: | 2.795 |
| $HfO_2$: | 0.4. |

The thus-produced crystal has a green colour with a sky-bluish shade.

EXAMPLE 33

A single-crystalline jewelry material on the basis of lutecium-aluminum garnet $Lu_3Al_5O_{12}$ containing europium in the amount of 0.08% by weight and zirconium in the amount of 0.075% by weight is produced following the procedure similar to that of Example 1. As the starting components a mixture of oxides is used having the following composition, percent by weight:

| | |
|---|---|
| $Lu_2O_3$: | 69.91 |
| $Al_2O_3$: | 29.89 |
| $Eu_2O_3$: | 0.1 |
| $ZrO_2$: | 0.1. |

The thus-produced crystal has a bright deep-violet colour matching that of amethyst.

EXAMPLE 34

A single-crystalline jewelry material based on $Lu_3Al_5O_{12}$ is produced according to Example 33 hereinabove, but instead of zirconium it contains hafnium in the amount of 0.1% by weight. The thus-produced crystal has a deep-violet colour close to that of amethyst.

EXAMPLE 35

A single-crystalline jewelry material based on $Lu_3Al_5O_{12}$ is produced according to the foregoing Example 33, but instead of zirconium silicon is used in the amount of 0.05% by weight. The resulting crystal has a bright deep-violet colour similar to that of amethyst.

INDUSTRIAL APPLICABILITY

Owing to a broad range of the obtained colours, brightness and purity of dyeings of various shades and intensities, colour uniformity along the length of a single-crystal, preservation of a high optical uniformity, transparency and other properties of garnets defining their value, the materials according to the present invention find their use in the manufacture jewelry of, for example in making insertion pieces for jewelry simulating emerald, aquamarine and sapphire, amethyst.

We claim:

1. A single crystalline aluminum garnet material consisting of $Re_3Al_5O_{12}$, wherein Re is an element from the group consisting of yttrium, dysprosium, holmium, erbium, thulium and lutecium, and two dyeing additives, the first which is an element from the group consisting of europium in an amount of $10^{-3}$ to 3% by weight and ytterbium in an amount of 0.1 to 61.3% by weight and the second of which is an element from the group consisting of zirconium in an amount from $10^{-4}$ to 1% by weight, silicon in an amount of $10^{-4}$ to 1% by weight and hafnium in amount of $10^{-3}$ to 3% by weight.

2. A single-crystalline material according to claim 1, wherein Re is yttrium; one said dyeing additive is ytterbium in an amount of from 0.1 to 9% by weight; and another said dyeing additive is zirconium in an amount of from $10^{-3}$ to 1% by weight and said material imparts a green color of a moderate brightness.

3. A single-crystalline material according to claim 1, wherein Re is yttrium; one said dyeing additive is ytterbium in an amount of 0.1 to 25% by weight; and another said dyeing additive is an element from the group consisting of silicon in an amount of $10^{-3}$ to 1% by weight and hafnium in an amount of $10^{-2}$ to one percent by weight and said material imparts a bright-green color.

4. A single-crystalline material according to claim 1, wherein Re is yttrium; one said dyeing additive is ytterbium in an amount of from 25 to 61.3% by weight; and another said dyeing additive is silicon in an amount of from $10^{-4}$ to 0.1% by weight and said material imparts a green-sky-blue to sky-blue color.

5. A single-crystalline material according to claim 1, wherein Re is yttrium; and one said dyeing additive is ytterbium in an amount of from 10 to 61.3% by weight; and another said dyeing additive is zirconium in an amount of from $10^{-4}$ to 0.1% by weight and said material imparts a blue to violet-blue color.

6. A single-crystalline material according to claim 1, wherein Re is yttrium; one said dyeing additive is europium in an amount of from 0.01 to 1% by weight; and another said dyeing additive is an element from the group consisting of zirconium in an amount of $10^{-2}$ to 0.5% by weight, silicon in an amount of $10^{-2}$ to 0.5% by weight and hafnium in an amount of from $10^{-2}$ to 1% by weight and said material imparts a bright-blue color resembling the color of a naturally occurring sapphire.

7. A single-crystalline material according to claim 1, wherein Re is dysprosium; one said dyeing additive is ytterbium in an amount of from 0.1 to 30% by weight; and another said dyeing additive is an element from the group consisting of silicon and hafnium in an amount ranging from $10^{-2}$ to 1% by weight and said material imparts a yellowish-green to green.

8. A single-crystalline material according to claim 1, wherein Re is erbium; one said dyeing additive is europium in an amount of from 0.01 to 1% by weight; and another said dyeing additive is an element from the group consisting of zirconium, silicon, and hafnium in an amount of from $10^{-2}$ to 1% by weight and said material imparts a pink-violet to dark-blue color.

9. A single-crystalline material according to claim 1, wherein Re is lutecium; one said dyeing additive is europium in an amount of from 0.01 to 1% by weight; and another said dyeing additive is an element from the group consisting of zirconium in an amount of from $10^{-2}$ to 0.5% by weight, silicon in an amount of from $10^{-2}$ to 0.5% by weight, and hafnium in an amount of from $10^{-2}$ to 1% by weight and said material imparts a bright-violet color matching the color of a naturally occurring amethyst.

* * * * *